(12) United States Patent
Feler et al.

(10) Patent No.: US 11,137,692 B2
(45) Date of Patent: Oct. 5, 2021

(54) METROLOGY TARGETS AND METHODS WITH OBLIQUE PERIODIC STRUCTURES

(71) Applicant: KLA-TENCOR CORPORATION, Milpitas, CA (US)

(72) Inventors: Yoel Feler, Haifa (IL); Mark Ghinovker, Yoqneam Illit (IL); Alexander Svizher, Haifa (IL); Vladimir Levinski, Migdal HaEmek (IL); Inna Tarshish-Shapir, Yokneam Illit (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/313,972

(22) PCT Filed: Nov. 29, 2018

(86) PCT No.: PCT/US2018/062931
§ 371 (c)(1),
(2) Date: Dec. 28, 2018

(87) PCT Pub. No.: WO2019/139685
PCT Pub. Date: Jul. 18, 2019

(65) Prior Publication Data
US 2020/0124982 A1    Apr. 23, 2020

Related U.S. Application Data

(60) Provisional application No. 62/617,086, filed on Jan. 12, 2018.

(51) Int. Cl.
*G03F 7/20*    (2006.01)
*G03F 9/00*    (2006.01)

(52) U.S. Cl.
CPC ........ *G03F 7/70633* (2013.01); *G03F 9/7076* (2013.01)

(58) Field of Classification Search
CPC ............. G03F 7/70633; G03F 7/70625; G03F 7/70616; G03F 7/70683; G03F 7/7085;
(Continued)

(56) References Cited

U.S. PATENT DOCUMENTS 6,921,916 B2    7/2005    Adel et al.
2004/0137341 A1    7/2004    Niu et al.
(Continued)

FOREIGN PATENT DOCUMENTS

WO    2017055106 A1    4/2017

OTHER PUBLICATIONS

ISA/KR, International Search Report and Written Opinion for PCT/US2018/062931 dated Mar. 13, 2019.

*Primary Examiner* — Mesfin T Asfaw
(74) *Attorney, Agent, or Firm* — Hodgson Russ LLP

(57) ABSTRACT

Metrology targets, design methods and measurement methods thereof are provided with periodic structure(s) which are oblique with respect to orthogonal production axes X and Y of the lithography tool—enabling more accurate overlay measurements of devices having diagonal (oblique, tilted) elements such as DRAM devices. One or more oblique periodic structure(s) may be used to provide one- or two-dimensional signals, with respect to one or more layers, possibly providing overlay measurements for multiple steps applied to one layer. The oblique periodic structure(s) may be used to modify current metrology target designs (e.g., imaging targets and/or scatterometry targets) or to design new targets, and measurement algorithms may be adjusted respectively to derive signals from the oblique periodic structure(s) and/or to provide pre-processed images thereof.

(Continued)

The disclosed targets are process compatible and reflect more accurately the device overlays with respect to various process steps.

22 Claims, 7 Drawing Sheets

(58) Field of Classification Search
CPC ........ G03F 9/7088; G03F 9/7046; G03F 1/84; G03F 9/7003; G03F 9/7084; G03F 9/7076; G03F 9/708; G03F 9/7069; G03F 9/7073; G03F 1/42; G03F 1/44; G03F 7/70258; G03F 9/7007; G03F 7/70641; G03F 7/70133; G03F 7/7065; G03F 7/70516; G03F 7/705; G01N 21/956; H01L 22/12; H01L 22/24; H01L 22/26
See application file for complete search history.

(56) References Cited

U.S. PATENT DOCUMENTS

| | | |
|---|---|---|
| 2007/0008533 A1 | 1/2007 | Ghinovker |
| 2007/0081170 A1* | 4/2007 | Sezginer ............. G03F 7/70633 356/625 |
| 2009/0291513 A1 | 11/2009 | Ghinovker et al. |
| 2015/0130031 A1 | 5/2015 | Yoshino |
| 2015/0138555 A1 | 5/2015 | Dai et al. |

* cited by examiner

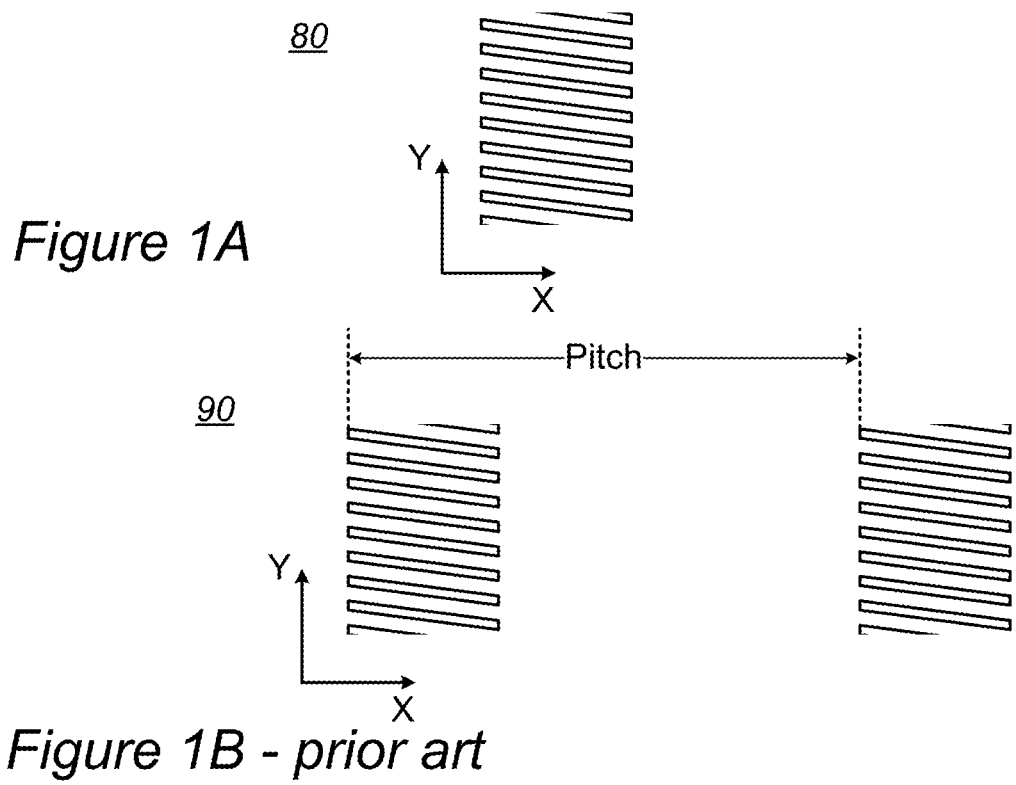
*Figure 1A*
*Figure 1B - prior art*
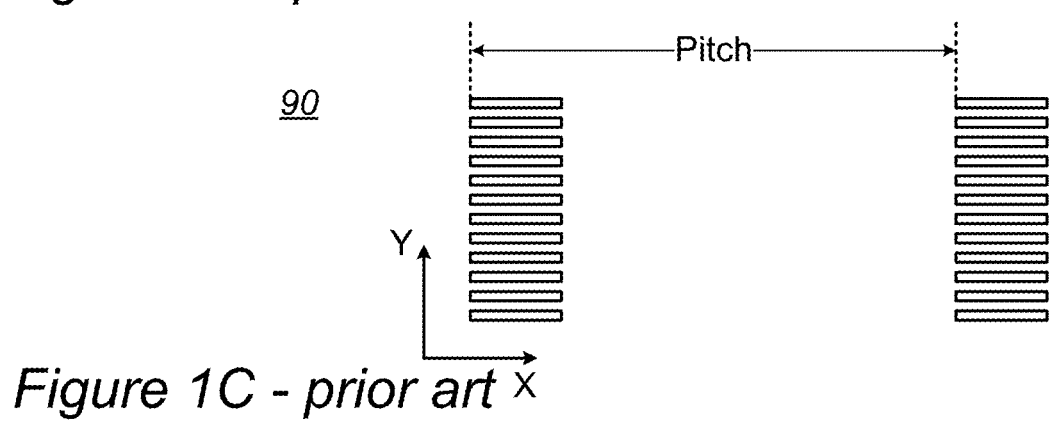
*Figure 1C - prior art*
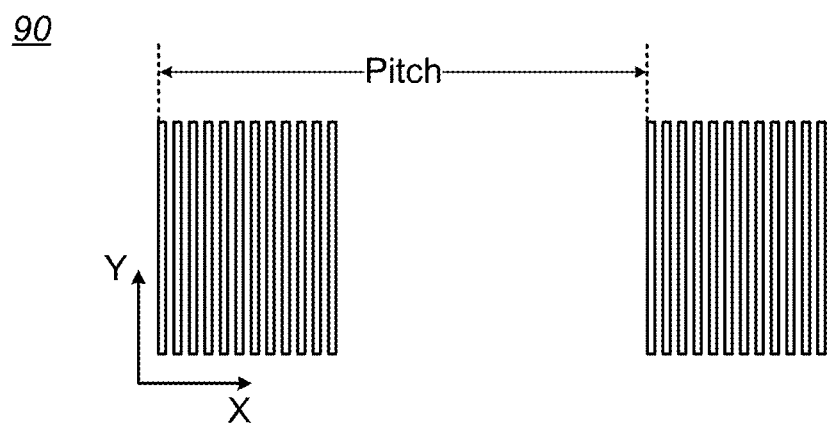
*Figure 1D - prior art*

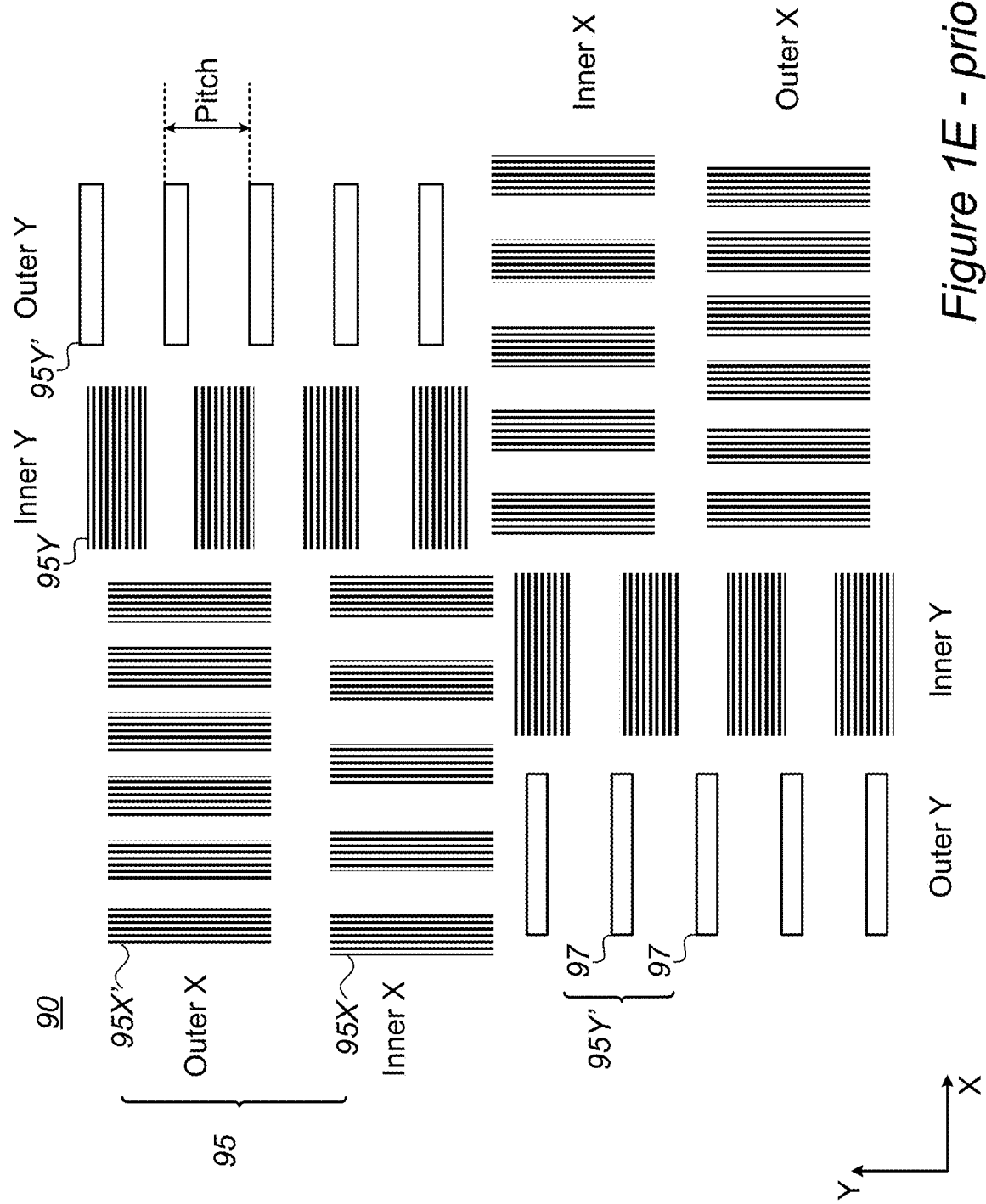
*Figure 1E - prior art*

205 — Identifying, in a device design, oblique structures with respect to the lithography production tool axes X and Y 210 — Designing the oblique periodic structure(s) of the metrology target at a same layer and at a same angle to the axes X and Y as the identified oblique structures 220 — Configuring periodic structure(s) of metrology target(s) to be oblique with respect to axes X and Y of the lithography tool 230 — Segmenting elements of the periodic structure(s) to approach or reach the minimal design rule pitch 235 — Designing the segments to be rectangular, with perpendicular edges 240 — Designing any of imaging, SEM and/or scatterometry targets accordingly 250 — Adjusting the respective measurement algorithms to utilize the oblique periodic structures 255 — Applying image processing and possibly re-pixelization to prepare images of targets with oblique periodic structures to analysis by corresponding metrology algorithms 257 — Applying a corresponding model, projected on the oblique measurement direction, to derive one dimensional signals of corresponding periodic structures and using them for the overlay derivation

*Figure 8*

METROLOGY TARGETS AND METHODS WITH OBLIQUE PERIODIC STRUCTURES

CROSS REFERENCE TO RELATED APPLICATIONS

This application claims the benefit of U.S. Provisional Patent Application No. 62/617,086 filed on Jan. 12, 2018, which is incorporated herein by reference in its entirety.

BACKGROUND OF THE INVENTION

1. Technical Field

The present invention relates to the field of metrology, and more particularly, to metrology target design.

2. Discussion of Related Art

U.S. Pat. No. 6,921,916, which is incorporated herein by reference in its entirety, discloses overlay mark for determining the relative position between two or more successive layers of a substrate or between two or more separately generated patterns on a single layer of a substrate; and U.S. Patent Publication No. 2007/0008533, which is incorporated herein by reference in its entirety, discloses overlay targets having flexible symmetry characteristics and metrology techniques for measuring the overlay error between two or more successive layers of such targets.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a metrology target comprising a plurality of periodic structures and produced by a lithography tool having orthogonal production axes X and Y, wherein at least one of the periodic structures is oblique with respect to axes X and Y.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 1A-1E are high-level schematic illustrations of one layer of a device (FIG. 1A) and prior art approaches (FIGS. 1B-1E) for providing overlay metrology targets to measure overlay between different layers or features of devices 80.

FIGS. 6A and 6B are high-level schematic illustrations of metrology targets, where FIG. 6A illustrates a prior art target and FIG. 6B illustrates a target according to some embodiments of the invention.

FIG. 8 is a high-level flowchart illustrating a method, according to some embodiments of the invention.

DETAILED DESCRIPTION OF THE INVENTION

Figure 2A:
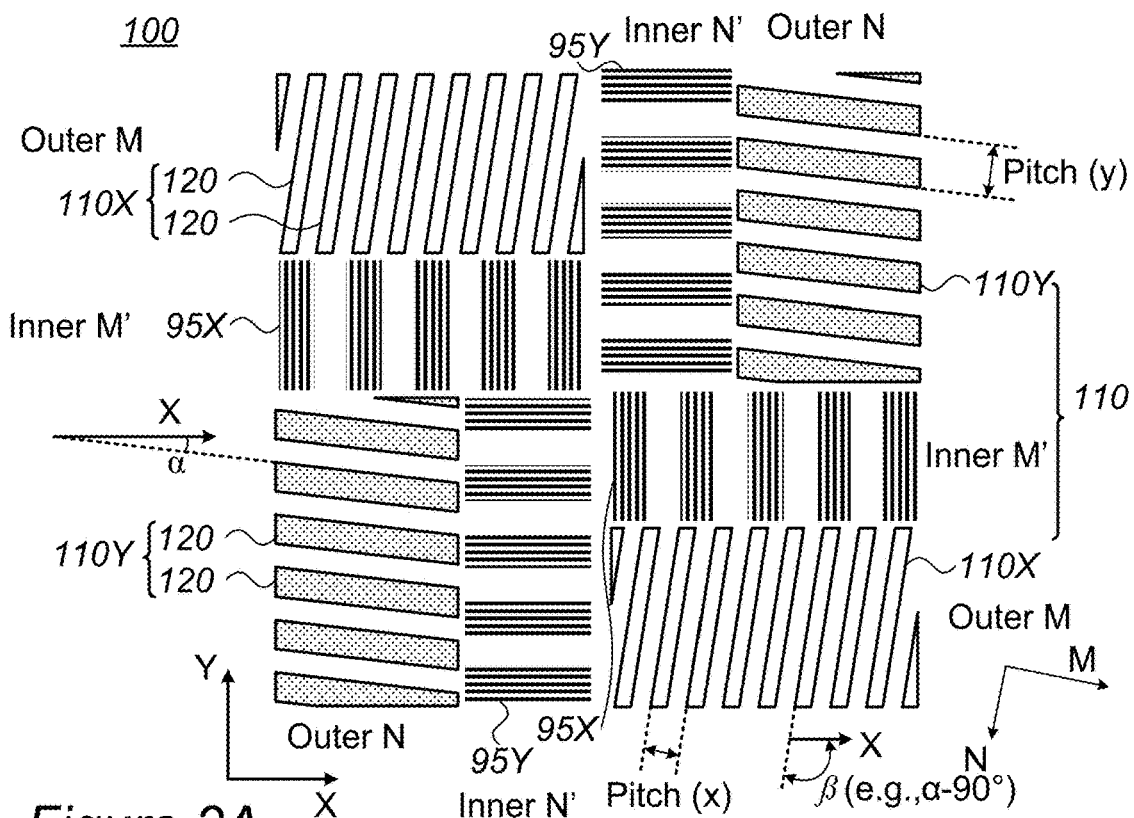
FIGS. 2A, 2B and 3-5 are high-level schematic illustrations of metrology targets, periodic structures and elements threreof, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation in some range, e.g., the infrared range, the visual range, ultraviolet or even shorter wave radiation such as x rays, and possibly even particle beams.

Embodiments of the present invention provide efficient and economical methods and mechanism for process compatible designs for measurement tilted semiconductor devices and thereby provide improvements to the technological field of metrology and semiconductor production. New overlay mark designs and algorithmic approaches for process compatible designs are provided—for reduction of overlay measurement inaccuracy.

In certain embodiments, metrology targets, design methods and measurement methods thereof are provided with periodic structure(s) which are oblique with respect to orthogonal production axes X and Y of the lithography tool—enabling more accurate overlay measurements of devices having diagonal (oblique, tilted) elements such as DRAM devices. One or more oblique periodic structure(s) may be used to provide one- or two-dimensional signals, with respect to one or more layers, possibly providing overlay measurements for multiple steps applied to one layer. The oblique periodic structure(s) may be used to modify current metrology target designs (e.g., imaging targets and/or scatterometry targets) or to design new targets, and measurement algorithms may be adjusted respectively to derive signals from the oblique periodic structure(s) and/or to provide pre-processed images thereof. The disclosed targets are process compatible and reflect more accurately the device overlays with respect to various process steps.

FIGS. 1A-1E are high-level schematic illustrations of one layer of a device 80 (FIG. 1A) and prior art approaches (FIGS. 1B-1E) for providing overlay metrology targets 90 to measure overlay between different layers or features of devices 80.

FIG. 1A illustrates schematically structural characteristics of many modern semiconductor devices, e.g., DRAM (dynamic random-access memory) devices, namely that they have at least one layer which is aligned at a specified tilt to the regular Cartesian coordinates of the lithography tool, such as a scanner having X and Y axes (for example, having a tilt of 22° to X).

On-device optically based overlay (OVL) metrology is unachievable at this moment since the design rule pitches are unresolved by modern optical technology for both Imaging and SCOL (scatterometry based) OVL tools. Instead of it, OVL measurement is performed on specially designed "proxy" metrology targets which have typical scales (pitches) which are larger than a hundred nanometers, in contrast of typical device pitches of few 10 nm or less. Moreover, standard targets are aligned by the X-Y directions only.

FIGS. 1B-1E demonstrate prior art approaches to measure the misalignments of device layers with tilted structures using standard XY aligned target, such as designing the XY aligned target with device-like segmentation (e.g., a periodic target with periodic structures having obliquely segmented elements, possibly at minimal design rule pitch)—illustrated schematically in FIG. 1B, or—designing segmented targets (possibly at minimal design rule pitch) which do not resemble the devices in the tilt—illustrated schematically in FIGS. 1C-1E—for example FIG. 1C illustrates schematically segmentation perpendicularly to the periodic structures' elements and along the periodic structure measurement direction, FIG. 1D illustrates schematically segmentation parallel to the periodic structures' elements and perpendicularly to the periodic structure measurement direction, and FIG. 1E illustrates schematically segmented two-dimensional two-layered imaging targets. It is noted that the prior art targets 90, as well as the following disclosed targets are illustrated schematically, showing partial sections of otherwise fully designed targets with respect to the dimensions and extent of the periodic structures.

However, a main difficulty is that none of the prior art target designs is process compatible (or even well printed), symmetric and has device-like behavior, particularly with respect to the tilted structures. For example, targets 90 designed according to the principles illustrated in FIGS. 1B, 1C and 1D typically yield overlay values which do not reflect well the overlay of the device and have heavy printability problems (targets 90 illustrated in FIGS. 1B and 1C have worse printability than targets 90 illustrated in FIG. 1D). Similar difficulties arise using an extended design, illustrated schematically in FIG. 1E, which may be composed from elements illustrated in FIGS. 1B-1D. Segmented two-dimensional two-layered imaging targets 90 may comprise inner X and inner Y periodic structures 95X, 95Y, outer X and outer Y periodic structures 95X', 95Y', collectively denoted periodic structures 95. In particular, such structures are typically defined by the constraints that (i) Outer X periodic structure 95X' is orthogonal to Outer Y periodic structure 95Y'; (ii) Inner X periodic structure 95X is orthogonal to Inner Y periodic structure 95Y; (iii) Outer X periodic structure 95X' is parallel to Inner X periodic structure 95X; and (i) Outer Y periodic structure 95Y' is parallel to Inner Y periodic structure 95Y.

In contrast to the prior art, disclosed below are targets 100 and methods 200 which resolve the difficulties related to the measurability and process compatibility of prior art targets, and also reflect the misregistration which the devices with tilted structures encounter. The following approaches provide modifications applicable to both imaging and scatterometry overlay target designs, and the presented examples are schematic and non-limiting. In disclosed targets 100, at least one periodic structure and/or at least one layer is not aligned along the X and Y directions and are applicable to either: (i) measure only one direction (illustrated schematically as direction M in FIGS. 4 and 5), which unrelated to the Scanner X or tool X direction, and may reflect the tilt of the device structures—In this direction, Outer and Inner structures are parallel (Outer M is parallel to Inner M); or measure the vector of overlay between the layers (possibly, layers may be produced from two consecutive processes, like lines in one direction and a cut into another direction), requiring two directions denoted as directions M and N in FIGS. 2A and 2B, then we need only require that corresponding Outer periodic structures are not parallel to each other and that corresponding Inner periodic structures are not parallel to each other—denoted schematically in FIG. 2A as Outer M (first pair of gratings) not parallel to Outer N (second pair of gratings), and Inner M' (first pair of gratings) not parallel to Inner N'(second pair of gratings). It is noted that while some non-parallel relations are illustrated as being perpendicular—this selection of angles is presented for explanatory purposes only, and is not limiting. It is noted that the description above provides a non-limiting example, and may be implemented along similar lines for different target types, such as, for example, multilayer targets, targets with assist features on the same and other layers, and also the targets which produce the measurement signal using various methods, such as direct imaging, Moiré effect imaging, scatterometry etc.

It is noted that disclosed target design principles may be applied to Moiré-effect-based targets. e.g., as disclosed in U.S. Pat. No. 10,101,592, incorporated herein by reference in its entirety.

FIGS. 2A, 2B and 3-5 are high-level schematic illustrations of metrology targets 100, periodic structures 110 and elements 120 thereof, according to some embodiments of the invention. While in FIGS. 2A, 2B and 3-5 some elements 120 of periodic structures 100 (and elements 97 of periodic structures 95) are illustrated as whole bars, in various embodiments elements 120 (and 97) may be segmented in various directions (e.g., along or across the respective measurement direction, or obliquely, see e.g., FIGS. 7A-7C below). While in FIGS. 2A, 2B and 3-5 some elements 120 of periodic structures 100 (and elements 97 of periodic structures 95) are illustrated as segmented bars, in various embodiments elements 120 (and 97) may be unsegmented or segmented in a different direction.

Metrology targets 100 may comprise a plurality of periodic structures 110, each having recurring elements 120 (illustrated explicitly in FIG. 2A) and be produced by a lithography tool (e.g., scanner, not shown) having orthogonal production axes X and Y. At least one of the periodic structures is oblique (diagonal) with respect to axes X and Y. For example, in FIG. 2A, periodic structures 95X, 95Y, corresponding to the inner X and inner Y periodic structures of imaging target 90 illustrated in FIG. 1E, are also part of metrology targets 100, while outer X and outer Y periodic structures 95X', 95Y' of imaging target 90 illustrated in FIG. 1E, are replaced by oblique periodic structures 110X, 110Y at angles α and β, respectively to the X axis—possibly to correspond to the angle(s) of semiconductor devices produced by the lithography tool. In certain embodiments, periodic structures 110X, 110Y may be orthogonal to each other (e.g., β=α−90°), e.g., be oblique with respect to axes X and Y and periodic along two non-parallel directions (e.g., orthogonal directions). Oblique periodic structures 110X, 110Y are denoted collectively as oblique periodic structures 110. It is noted that in various embodiments, at least two of the periodic structures may be placed side-by-side.

Figure 2B:
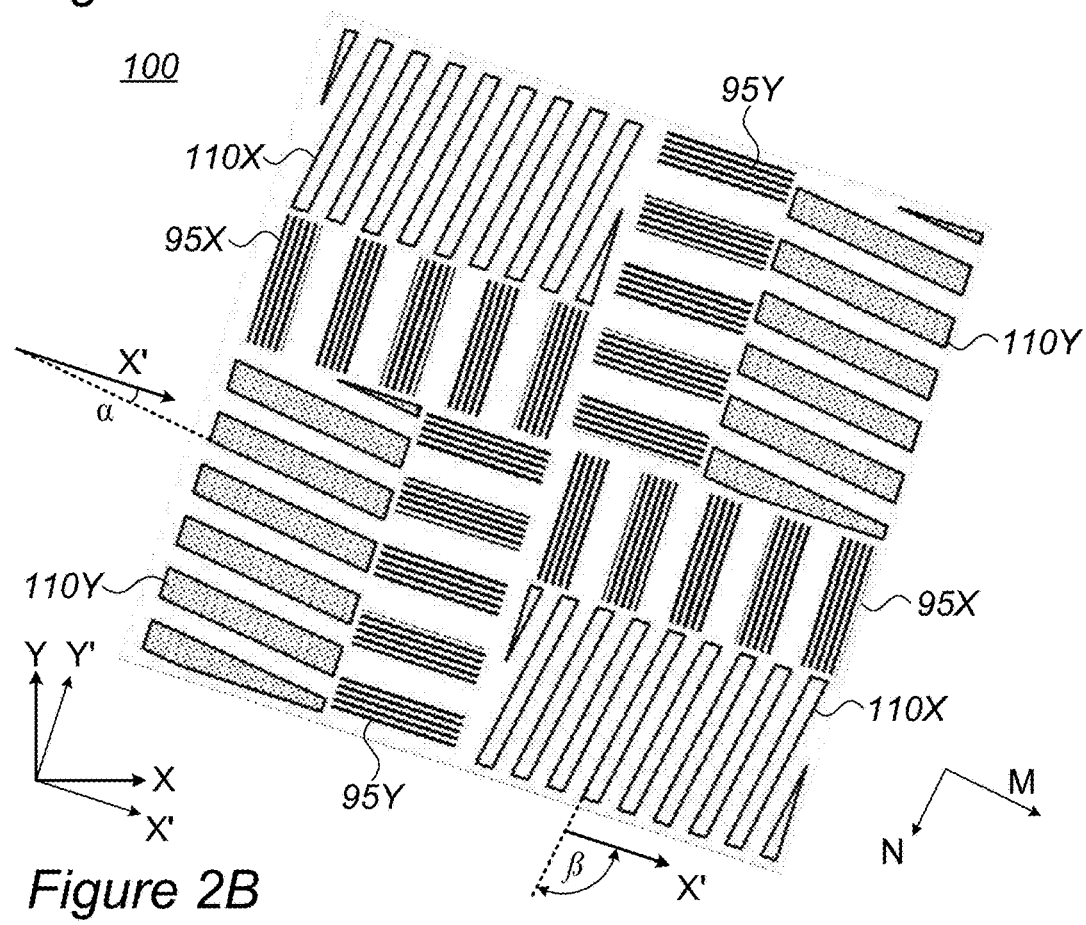

In certain embodiments, oblique periodic structures 110 may form angles of between 20° and 70° respect to corresponding axes X and Y (and/or tilted axes X' and Y' in case target 110 is tilted as in FIG. 2B).

Figure 4:
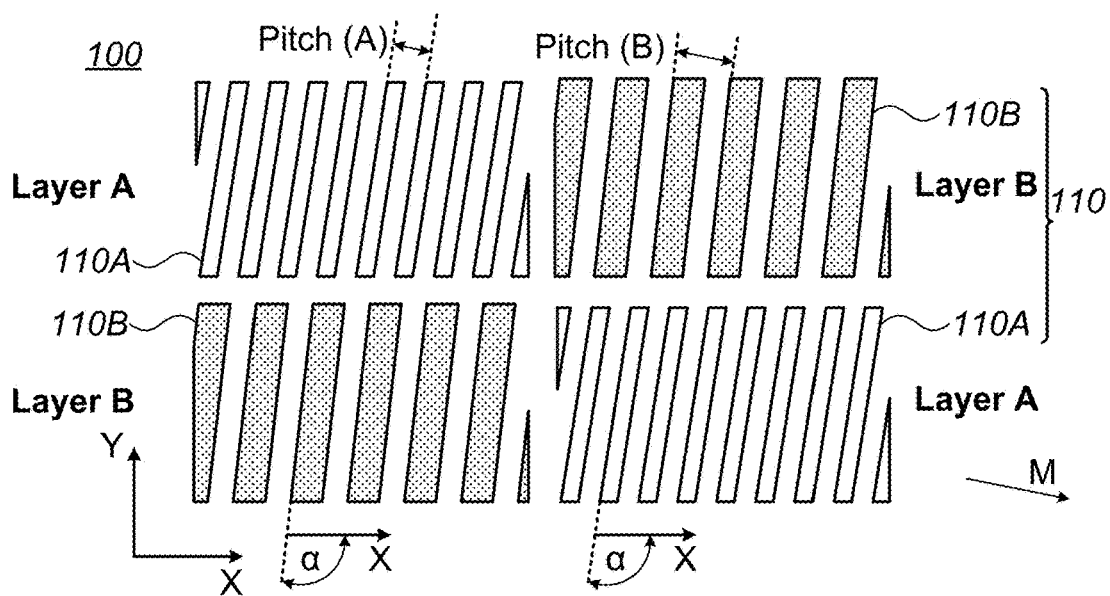
Figure 5:
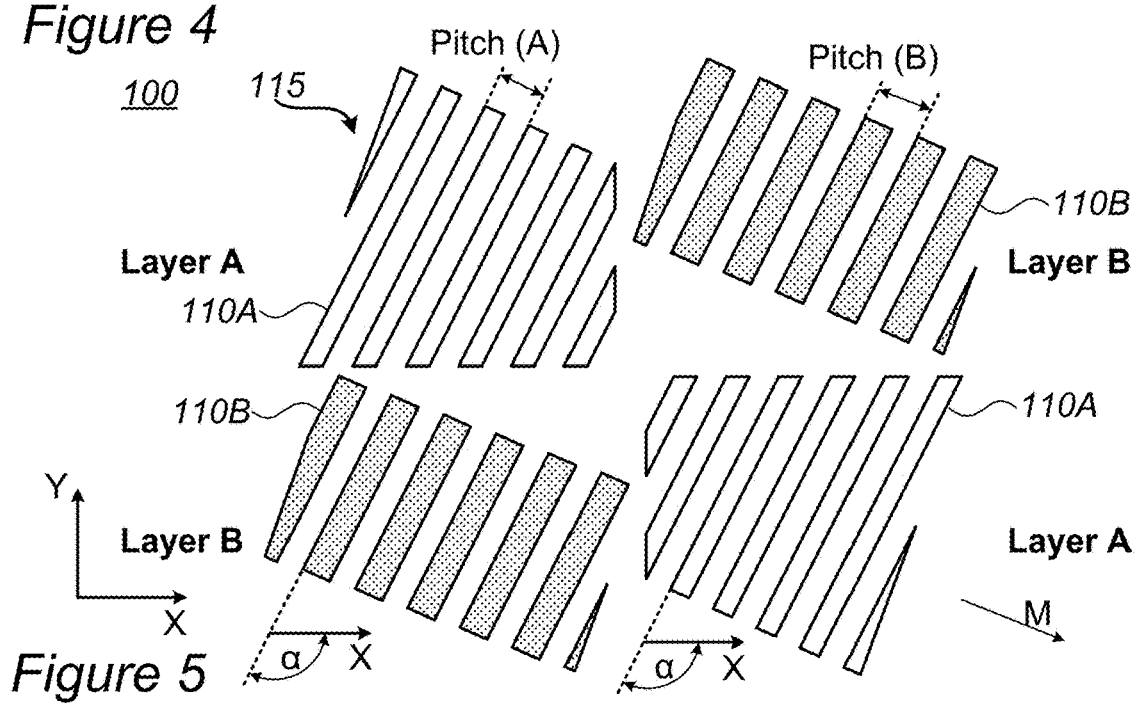

Metrology targets 100 may comprise two, three or more layers, and oblique periodic structures 110 may be designed in one or more of the layers. Metrology targets 100 may comprise one, two, or possibly more measurement directions, and oblique periodic structures 110 may be designed in one or more of the measurement directions. In certain embodiments, different oblique periodic structures 110 may be of one, two or more types, e.g., differing in pitch and/or CD (critical dimension). For example, FIGS. 2A and 2B illustrate schematically metrology targets 100 with different oblique periodic structures 110X, 110Y along two measurement directions in one layer, and FIGS. 4 and 5 illustrate schematically metrology targets 100 with different oblique periodic structures 110A, 110B along one measurement direction in two layers. Various embodiments comprise same and/or different oblique periodic structures 110 in any combination of measurement directions and layers, depending e.g., on the corresponding device designs. Oblique periodic structures 110A, 110B are denoted collectively as oblique periodic structures 110.

Figure 3:
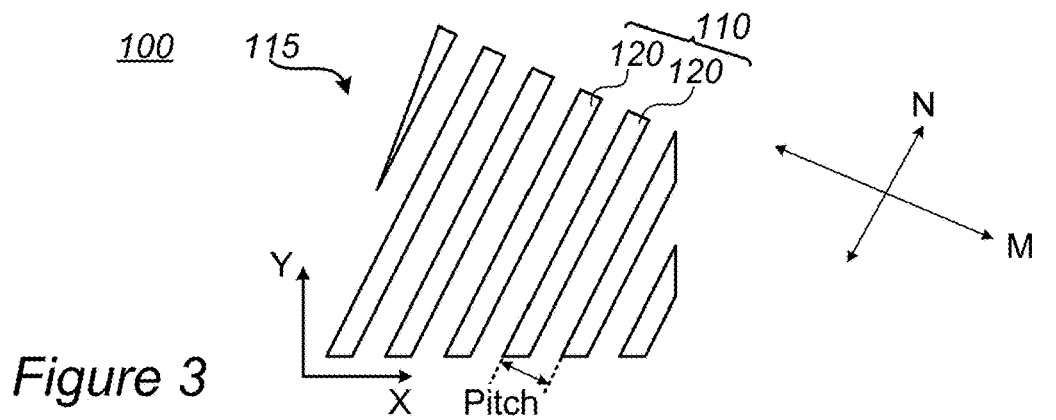

Concerning periodic structure illustrated schematically in FIG. 3, it is noted that such structures may be applied as any part of any fully-designed target 100, emphasizing that any of the disclosed periodic structures may be printed in non-rectangular shapes (possibly with any number of sides), possibly relating to the available real estate. The two corresponding periodic structures may be rotationally symmetric (by 180° rotations) with respect to each other, e.g., to allow TIS (tool induced shift) error measurement and reduction.

As illustrated in FIGS. 2A and 2B, metrology targets 100 may be tilted with respect to the X and Y axes of the lithography tool, e.g., to be designed along axes X' and Y'. It is noted that while prior art targets 90, as illustrated e.g., in FIG. 1E, may be tilted as whole targets, disclosed metrology targets 100 comprise oblique periodic structure(s) 110 with respect to the tilted axes X' and Y' as well, and have the direction of periodicity (along which the respective pitch is measured) oblique with respect to the tiled axes as well. In certain embodiments, disclosed metrology targets 100 may have at least two non-orthogonal measurement directions, e.g., one corresponding to periodic structures 95 and another one corresponding to periodic structures 110.

In certain embodiments, with respect to any of the target types, oblique periodic structures 110 may be set to fill rectangles with sides along the X and Y axes, as illustrated e.g., in FIGS. 2A and 4. In certain embodiments, oblique periodic structures 110 may be set to fill rectangles with sides along the tilted X' and Y' axes, as illustrated e.g., in FIG. 2B.

In certain embodiments, with respect to any of the target types, oblique periodic structures 110 may be set to fill convex quadrilateral(s) 115 (or, possibly, shapes with more than four sides), as illustrated e.g., in FIGS. 3 and 5, designed according to available wafer real estate.

In certain embodiments, with respect to any of the target types, oblique periodic structures 110 may be set to fill any specified space designed according to available wafer real estate.

In certain embodiments, e.g., if the rotational symmetry is not required, targets 100 may comprise a single periodic structure 110 per measurement direction and per layer instead of a pair of periodic structures 110 per measurement direction and per layer illustrated above.

In various embodiments, targets 100 may comprise at least one intermediate layer having assist features between two of the periodic structures. The assist features may be oblique with respect to axes X and Y.

Figure 6B:
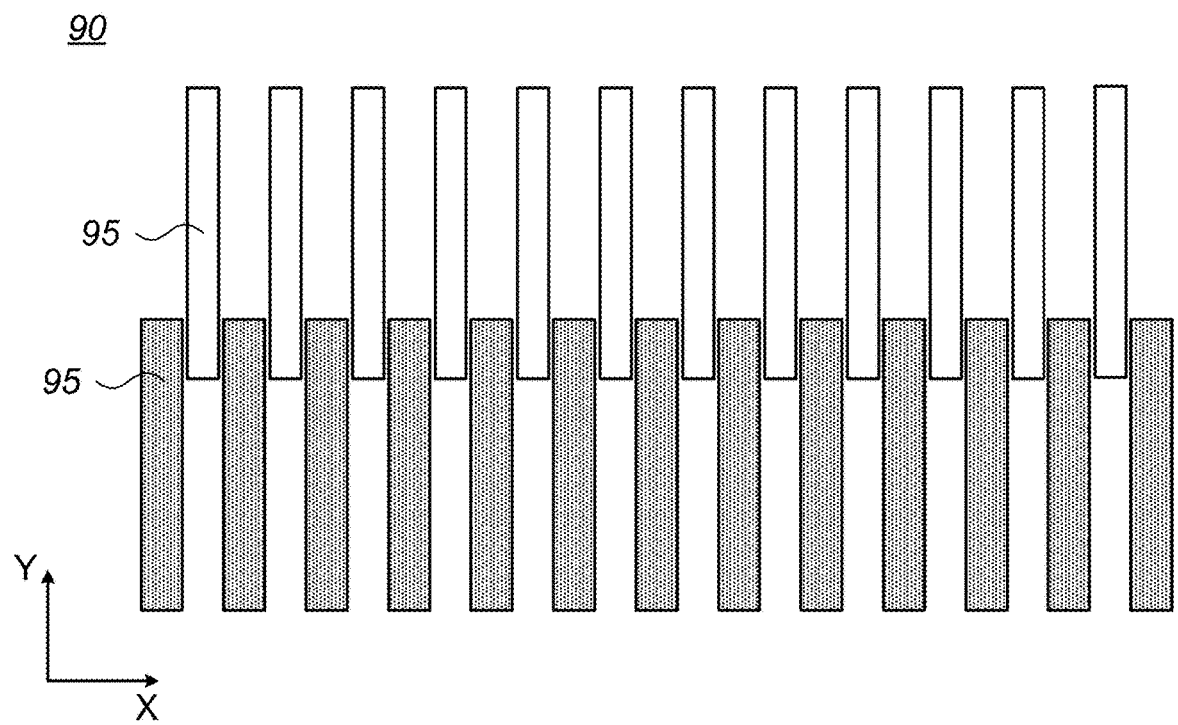
Figure 6B:
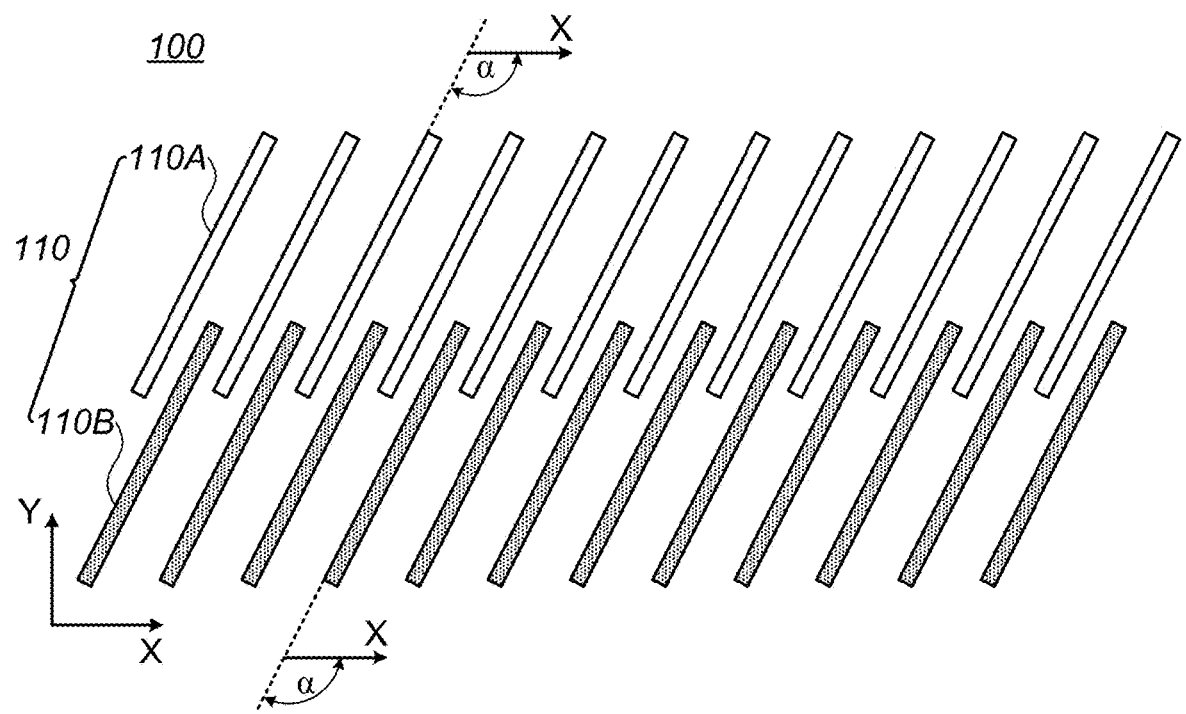

FIG. 6B is a high-level schematic illustration of metrology target 100, according to some embodiments of the invention, compared with prior art target 90 illustrated schematically in FIG. 6A. In certain embodiments, metrology target 100 may be configured as a SEM (scanning electron microscopy) target (e.g., a CDSEM, critical dimension scanning electron microscopy, target) and/or as an imaging target, having two partly overlapping, alternating periodic structures 110A, 110B (indicated collectively as oblique periodic structures 110) which are both oblique with respect to the X axis (at an angle indicated as α).

Figure 7A:
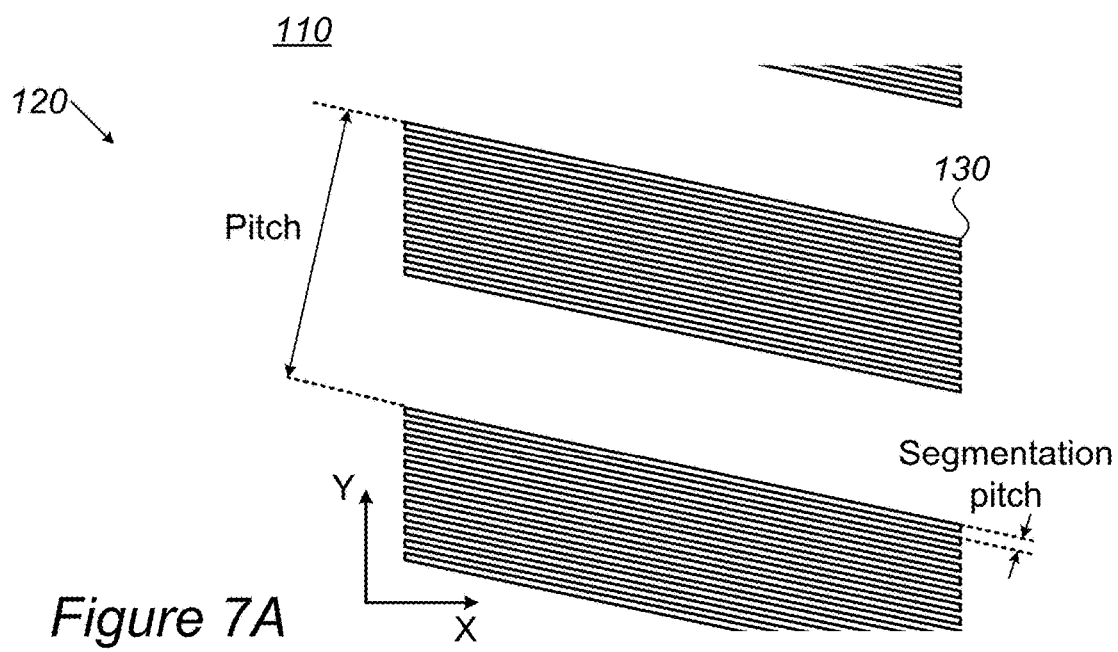
FIGS. 7A, 7B and 7C are high-level schematic illustrations segmentations edge configurations, according to some embodiments of the invention
Figure 7B:
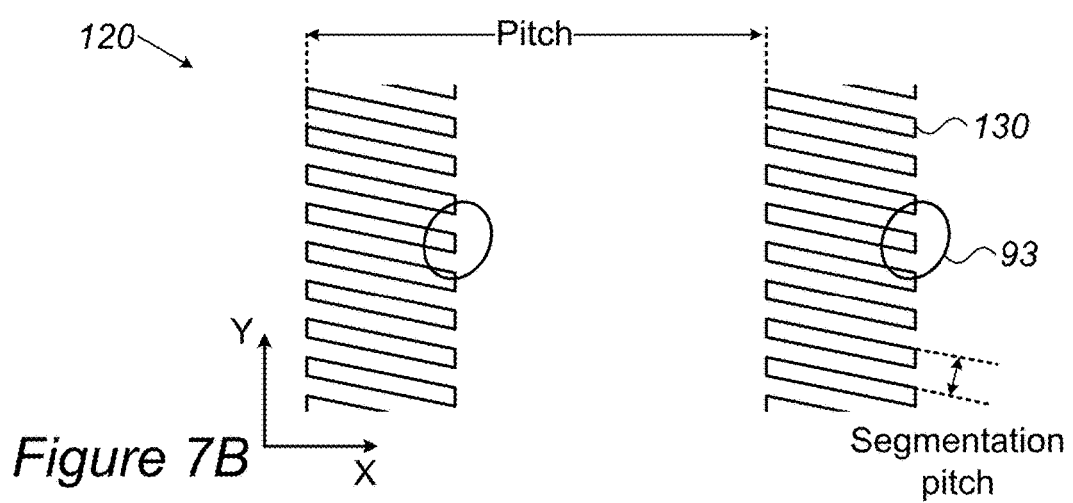
Figure 7C:
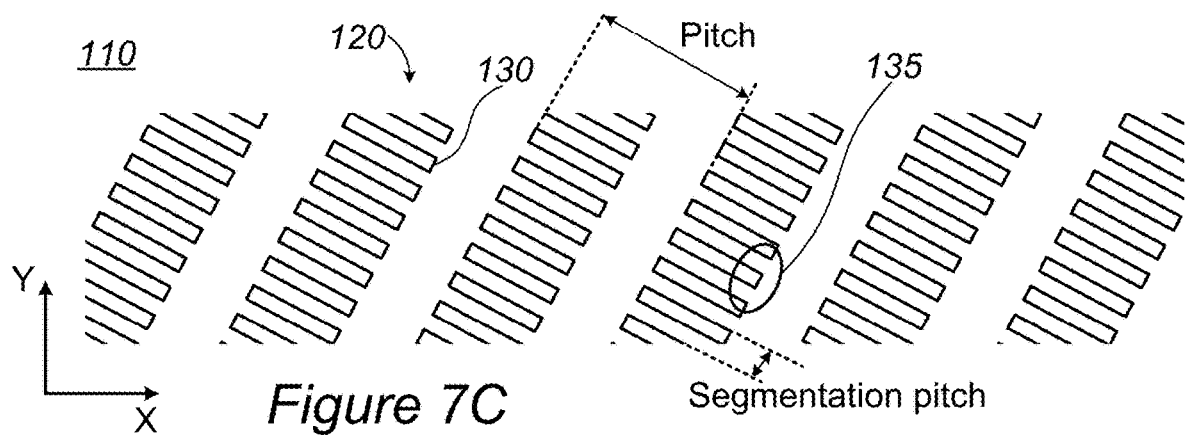

FIGS. 7A-7C are high-level schematic illustrations segmentations edge configurations, according to some embodiments of the invention. It is noted that the segmentation illustrated in 7B may cause printability problems, which may be solved by the segmentation illustrated in FIG. 7C and FIG. 7A.

In certain embodiments, oblique periodic structures 110 may be segmented, as illustrated schematically in FIG. 7A-7C, with elements 120 of periodic structures 110 being segmented to sub-elements 130 at a smaller pitch (denoted in FIG. 7A-7C as "segmentation pitch"), e.g., closer or similar to the device pitch. For example, the pitch of the segmentation may be e.g., one fifth or less of the pitch of corresponding periodic structure 110 (denoted in FIG. 7A-7C as "pitch").

In certain embodiments, the segmentation may be two dimensional.

FIGS. 7A-7C illustrate schematically initial designs of segmented oblique elements 120 in oblique periodic structures 110, carried out, e.g., using the customer design rule direction and using for example customer design rule for the segmentation—to ensure printability, with oblique periodic structure 110 having the required pitch, e.g., for imaging measurements. It is noted that in any of the disclosed designs, the spaces on mask may be filled with parallel SARF (sub resolution assist features), which are not shown herein to maintain clarity, and which improve the printability of targets designs 100.

It is noted that the terms "line" and "space", either on wafer or on the lithographic mask is used for ease of explanations and does not limit the scope of the invention. In particular, elements designated herein as lines and spaces may be constructed from various types of structures which may fill the respective lines and/or spaces, similarly or in different manners across the target. For example, spaces between different gratings as the periodic structures may be filled differently (with different type(s) of elements) than spaces within the grating.

In certain embodiments, sub-elements 130 (the segments of elements 120) are optimized for the specified illumination conditions to avoid or minimize printability issues. For example, the edges may be optimized by the standard techniques, like OPC (optical proximity correction), CMP (chemical mechanical planarization) assist, etc. Specifically, in case of tilted dipole illumination, segmentations designed according to the principles illustrated in FIG. 7A and FIG. 7C is expected to cause less printability issues than segmentation illustrated in FIG. 7B.

It is noted that while in semiconductor device design the exact configuration of the edges of device structures is less critical, metrology measurements of disclosed metrology targets 100 are sensitive to the details of segment edges and may be degraded by non-uniform production of segment edges. Accordingly, the inventors suggest designing symmetric edges (as illustrated with respect to the long axis of ellipse 135) rather than asymmetric edges (as illustrated with respect to the long axis of ellipse 93).

In various embodiments, a range of measurement algorithms may be used to extract the metrology measurements, such as algorithms described in U.S. Pat. No. 6,921,916 and U.S. Patent Publication No. 2007/0008533, incorporated herein by reference, and modifications thereof, as well as other algorithms such as 2D fit, correlation, etc., to find the required misregistration.

For example, the following non-limiting measurement algorithm may be used to measure targets 100 configured as imaging targets. First, image processing may be used to rotate captured images of targets 100, possibly with additional re-pixelization, to bring each pair of periodic structures 110 (e.g., Inner left and Inner right) to be parallel to the X or Y direction of the original target (e.g., corresponding to X and Y of lithography tool or to tilted X' and Y', see FIGS. 2A and 2B respectively). From the images, the centre of symmetry of each pair of periodic structures 110 may be derived, from which the X and Y centres of symmetry of the Inner and Outer structures may be calculated, and the vector between the centres of symmetry of the Inner and Outer structures provides the overlay. Clearly, any one- or two-dimensional measurement algorithm may be modified accordingly to provide metrology measurements of disclosed targets 100.

In various embodiments, other algorithms such as the following non-limiting example may be used. Taking as example periodic structure 110 illustrated in FIG. 3 (e.g., as part of extended targets 100)—the image (or partial image) of each periodic structure 110 in target 100 may be captured, the periodic model (class of functions) in the corresponding direction M may be chosen to be a sum of cosines and sines in direction M with periods P, 2P, 3P, . . . , nP (P being the Pitch) and chosen to be constant in the orthogonal direction N. The number of periods n may be chosen so that the n+1$^{th}$ harmonic is either irrelevant to the optical system or is empirically known to be smaller than the noise level (including the higher harmonics above n+1). The one-dimensional signal may be derived by projecting the chosen periodic model to the M direction to yield a one-dimensional signal, which can then be processed as in regular overlay algorithms using one-dimensional signal per periodic structure (as described e.g., in U.S. Pat. No. 6,921,916 and U.S. Patent Publication No. 2007/0008533, incorporated herein by reference, and other sources).

In certain embodiments, several periodic structures 110 may be designed in one layer, e.g., representing multiple process step applied to that layer, such as a production step and a cut step, possibly one or both being tilted with respect to the axes of the lithography tool (X, Y). For example, a produced layer may be regular (along X or Y axis) while a cut layer may be diagonal—requiring oblique periodic structures 110 to provide metrology measurements thereof.

It is emphasized that disclosed targets 100 may be of any type, and disclosed target design principles may be applicable to a wide range of metrology targets 100. Moreover, it is noted that the invention is not limited to specific metrology tools, techniques or target types. For example, targets 100 may be one-dimensional or two-dimensional targets, imaging targets, scatterometric targets of any type or moiré effect based targets, of any form or type, possessing the oblique periodic structure as part of their design.

FIG. 8 is a high-level flowchart illustrating a method 200, according to some embodiments of the invention. The method stages may be carried out with respect to metrology targets 100 described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. Certain embodiments comprise target design files of respective targets designed by embodiments of method 200. Method 200 may comprise the following stages, irrespective of their order.

Certain embodiments comprise target design methods 200 comprising identifying, in a device design, oblique structures with respect to the axes X and Y (stage 205) and designing the at least one oblique periodic structure of the metrology target at a same layer and at a same angle to the axes X and Y as the identified oblique structures (stage 210).

Certain embodiments comprise target design methods 200 comprising configuring at least one periodic structure of a metrology target, which is produced by a lithography tool having orthogonal production axes X and Y, to be oblique with respect to axes X and Y (stage 220).

In certain embodiments, method 200 may further comprise segmenting elements of the periodic structure(s) to approach or reach the minimal design rule pitch (stage 230) and possibly designing the segments to be rectangular, with perpendicular edges (stage 235).

In certain embodiments, method 200 may further comprise designing any of imaging, SEM (scanning electron microscopy) and/or scatterometry targets accordingly (stage 240) and adjusting the respective measurement algorithms to utilize the oblique periodic structures (stage 250). For example, in certain embodiments, method 200 may comprise applying image processing and possibly re-pixelization to prepare images of targets with oblique periodic structures to analysis by corresponding metrology algorithms (stage 255) and/or applying a corresponding model, projected on the oblique measurement direction, to derive one dimensional signals of corresponding periodic structures and using them for the overlay derivation (stage 257).

It is noted that disclosed methods may be applied to any type of metrology targets and may be implemented using any metrology tool technique. For example, methods 200 may be applied to integrate oblique periodic structure(s) as part of the design in any of: one-dimensional or one-dimensional targets, imaging targets, scatterometry targets of any type and/or Moiré-effect-based targets.

Advantageously, disclosed targets 100 and method 200 provide overlay measurements which express accurately the device overlay, e.g., providing the pattern placement error (PPE) and etch placement error (EPE) of target 100 to be very close to the errors of the minimal design rule dense device features. Moreover, disclosed targets 100 and method 200 enable measurement of diagonal (oblique) periodic structures, such as one- or two-dimensional measurements of target structures with non-orthogonal periodic structures in one or more layers—each of the previous and current layer(s) may comprise one or more oblique periodic structures 110. Disclosed targets are process compatible and closely correspond device production performance. Adjustment of segment edges of segmented elements of the oblique periodic structures 110 may further enhance the measurement accuracy, possibly with respect to the used illumination (e.g., dipole illumination, optionally rotated).

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function (s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A metrology target comprising a plurality of periodic structures that have a long dimension and a short dimension, wherein at least a first of the periodic structures is oblique with respect to a second of the periodic structures, wherein one of the first of the periodic structures and the second of the periodic structures is disposed as an inner periodic structure of the metrology target and another of the first of the periodic structures and the second of the periodic structures is disposed as an outer periodic structure of the metrology target, and wherein a plurality of the first of the periodic structures and a plurality of the second of the periodic structures are arrayed around a center of the metrology target such that the inner periodic structure is closer to the center than the outer periodic structure and such that the plurality of periodic structures of the inner periodic structure are arrayed with the long dimension extending in two orthogonal directions relative to the center.

2. The metrology target of claim 1, wherein the metrology target is configured as an imaging target, wherein the imaging target includes at least one target layer having the plurality of periodic structures, wherein the plurality of periodic structures are configured to be non-parallel.

3. The metrology target of claim 2, further comprising at least three target layers, wherein the each of the periodic structures is disposed within one of the target layers.

4. The metrology target of claim 1, wherein the metrology target is configured as a Moiré-effect-based target.

5. The metrology target of claim 4, wherein the Moiré-effect-based target includes at least one target layer having the plurality of periodic structures, wherein the plurality of periodic structures are configured to be non-parallel.

6. The metrology target of claim 1, wherein the metrology target has one measurement direction oblique to the second of the periodic structures, wherein the plurality of periodic structures are of two types differing in pitch and/or critical dimension.

7. The metrology target of claim 1, wherein each of the periodic structures is configured to fill rectangles having sides along X and Y axes of the metrology target.

8. The metrology target of claim 1, wherein each of the periodic structures is configured to fill a specified space, wherein the specified space is designed according to an available space on a wafer.

9. The metrology target of claim 1, wherein each of the periodic structures is configured to fill a convex quadrilateral, wherein the convex quadrilateral is designed according to an available space on a wafer.

10. The metrology target of claim 1, wherein the metrology target is a configured as a scanning electron microscopy target, the scanning electron microscopy target having two partly overlapping, alternating periodic structures, wherein the two partially overlapping, alternating periodic structures are oblique with respect to the second of the periodic structures.

11. The metrology target of claim 1, wherein each of the periodic structures includes one or more elements, wherein each of the elements has a segmentation.

12. The metrology target of claim 11, wherein the segmentation of each of the elements is two-dimensional.

13. The metrology target of claim 11, wherein a pitch of the segmentation of each of the elements is one fifth or less of a pitch of its corresponding periodic structure.

14. The metrology target of claim 11, wherein the segmentation of each of the elements is rectangular.

15. The metrology target of claim 1, wherein each of the first periodic structures form angles of between 20° and 70° with respect to the second of the periodic structures.

16. The metrology target of claim 1, wherein the metrology target further comprises at least one intermediate layer having assist features between two of the periodic structures.

17. The metrology target of claim 16, wherein the assist features are oblique with respect to the second of the periodic structures.

18. The metrology target of claim 1, wherein at least two of the periodic structures are placed side-by-side.

19. A target design file comprising the metrology targets of claim 1.

20. A target design method comprising configuring at least a first periodic structure of a metrology target to be oblique with respect to a second periodic structure of the metrology target, wherein the first periodic structure and the second periodic structure have a long dimension and a short dimension, wherein one of the first of the periodic structures and the second of the periodic structures is disposed as an inner periodic structure of the metrology target and another of the first of the periodic structures and the second of the periodic structures is disposed as an outer periodic structure of the metrology target, and wherein a plurality of the first of the periodic structures and a plurality of the second of the periodic structures are arrayed around a center of the metrology target such that the inner periodic structure is closer to the center than the outer periodic structure and such that the plurality of periodic structures of the inner periodic structure are arrayed with the long dimension extending in two orthogonal directions relative to the center.

21. The target design method of claim 20, further comprising:
    identifying, in a device design, oblique structures that are oblique with respect to the second periodic structure; and
    configuring the first periodic structure to be disposed within a same layer and at a same angle to the X and Y axes as the identified oblique structures.

22. A method of measuring metrology targets comprising:
    performing, using a processor and image processing and/or signal modelling, a metrology measurement of a metrology target to derive corresponding signals from oblique periodic structures;
    wherein the metrology target comprises a plurality of periodic structures that have a long dimension and a short dimension, wherein at least a first of the periodic structures is oblique with respect to a second periodic structure, wherein one of the first of the periodic structures and the second of the periodic structures is disposed as an inner periodic structure of the metrology target and another of the first of the periodic structures and the second of the periodic structures is disposed as an outer periodic structure of the metrology target, and wherein a plurality of the first of the periodic structures and a plurality of the second of the periodic structures are arrayed around a center of the metrology target such that the inner periodic structure is closer to the center than the outer periodic structure and such that the plurality of periodic structures of the inner periodic structure are arrayed with the long dimension extending in two orthogonal directions relative to the center.

* * * * *